(12) United States Patent
Zlataric

(10) Patent No.: US 11,708,703 B2
(45) Date of Patent: Jul. 25, 2023

(54) CARPORT TENT FARADAY CAGE DEVICE

(71) Applicant: Alan Zlataric, Algonquin, IL (US)

(72) Inventor: Alan Zlataric, Algonquin, IL (US)

( * ) Notice: Subject to any disclaimer, the term of this patent is extended or adjusted under 35 U.S.C. 154(b) by 0 days.

(21) Appl. No.: 17/884,835

(22) Filed: Aug. 10, 2022

(65) Prior Publication Data
US 2023/0056117 A1 Feb. 23, 2023

Related U.S. Application Data

(60) Provisional application No. 63/234,403, filed on Aug. 18, 2021.

(51) Int. Cl.
*H05K 9/00* (2006.01)
*E04H 15/02* (2006.01)
*E04H 15/54* (2006.01)

(52) U.S. Cl.
CPC .............. *E04H 15/02* (2013.01); *E04H 15/54* (2013.01); *H05K 9/0003* (2013.01); *H05K 9/009* (2013.01)

(58) Field of Classification Search
CPC ............................ H05K 9/0003; H05K 9/0001
See application file for complete search history.

(56) References Cited

U.S. PATENT DOCUMENTS

2019/0124799 A1* 4/2019 Bodi .................... E04H 6/42
2019/0133003 A1* 5/2019 McGhee ............. H05K 9/0001

* cited by examiner

*Primary Examiner* — Hung V Ngo
(74) *Attorney, Agent, or Firm* — Brennan, Manna & Diamond, LLC

(57) ABSTRACT

The present invention relates generally to the field of faraday cages. More specifically, the present invention relates to a carport tent faraday cage device. The device is primarily comprised of a tent body, further comprised of at least one roof frame, at least one wall frame, and at least one door. The tent body is comprised of three layers, an exterior layer, a middle layer, and an interior layer. Further, the tent body material has a middle layer that is comprised of a woven copper wire to prevent the electromagnetic radiation from entering the device. The device further is comprised of a grounding stake and a tether to direct the electrical current away from the device and into the ground. The device provides users with a device to store their vehicles, or other electronic devices without the risk of damage by electromagnetic radiation.

16 Claims, 6 Drawing Sheets

CARPORT TENT FARADAY CAGE DEVICE

CROSS-REFERENCE TO RELATED APPLICATION

The present application claims priority to, and the benefit of, U.S. Provisional Application No. 63/234,403, which was filed on Aug. 18, 2021, and is incorporated herein by reference in its entirety.

FIELD OF THE INVENTION

The present invention relates generally to the field of faraday cages. More specifically, the present invention relates to a carport tent faraday cage device. The device is primarily comprised of a tent body, further comprised of at least one roof frame, at least one wall frame, and at least one door. The roof frame and wall frame are both further comprised of at least one vertical frame member and at least one horizontal frame member. The tent body is comprised of three layers, an exterior layer, a middle layer, and an interior layer. Further, the tent body material has a middle layer that is comprised of a woven copper wire to prevent the electromagnetic radiation from entering the device. The device is further comprised of a rubber base, further comprised of wire mesh. The device further is comprised of a grounding stake and a tether to direct the electrical current away from the device and into the ground. The device provides users with a device to store their vehicles and other electronic devices without the risk of damage by electromagnetic radiation. The device acts as a faraday cage and keeps all contents unharmed by electromagnetic radiation. Accordingly, the present disclosure makes specific reference thereto. Nonetheless, it is to be appreciated that aspects of the present invention are also equally applicable to other like applications, devices, and methods of manufacture.

BACKGROUND

By way of background, a faraday cage is an enclosure made from conducting metals that blocks external electric fields. Faraday cages are commonly used to protect different kinds of electronic equipment from electrostatic discharges. A faraday cage works on the principle that when an electromagnetic field hits something that can conduct electricity, the charges remain on the exterior of the conductor rather than traveling inside. This means that a faraday cage constructed from a metal that can conduct electricity will prevent certain electromagnetic radiation from passing through. This applies to both constant, static, electric fields and changing, non-static, electric fields.

Electromagnetic pulses, solar flares, or any other electromagnetic radiation can cause serious damage to a vehicle's electronics. The vehicle can be rendered completely immobile, ultimately requiring extensive repairs or a full replacement. Other electronics can also be ruined by electromagnetic radiation without a proper storage area.

Faraday cages are very common in today's world. Microwave ovens are faraday cages that are used in most homes and businesses. Faraday cages are used to protect vital IT and other electrical equipment from electromagnetic pulses and lightning strikes.

Therefore, there exists a long-felt need in the art for an improved carport. There also exists a long-felt need in the art for a carport that can protect the electronics of a vehicle from electromagnetic radiation, like an EMP or solar flare. There also exists a long-felt need in the art for a faraday cage that an individual can park their vehicle in to protect the vehicle and other items from electromagnetic radiation. There also exists a long-felt need in the art for a safe, secure, and convenient storage area for any personal or commercial vehicle as well as other larger electronic devices.

The subject matter disclosed and claimed herein, in one embodiment thereof, comprises a carport tent faraday cage device. The device is primarily comprised of a tent body, further comprised of at least one roof frame and at least one wall frame, and at least one door. The device is comprised of a rubber base, further comprised of wire mesh and at least one entrance ramp to allow a vehicle to enter the device easily. At least one grounding stake of the device transfers any electromagnetic radiation that hits the device into the ground causing no electrical damage to any of the contents stored inside the device.

In this manner, the carport tent faraday cage device of the present invention accomplishes all of the foregoing objectives and provides a novel carport that can protect an individual's vehicles or other large electronics from electromagnetic radiation. Further, the device provides a way for a user to conveniently store valuable electronics without the risk of being damaged by electromagnetic radiation such as an EMP or a solar flare.

SUMMARY

The following presents a simplified summary in order to provide a basic understanding of some aspects of the disclosed innovation. This summary is not an extensive overview, and it is not intended to identify key/critical elements or to delineate the scope thereof. Its sole purpose is to present some general concepts in a simplified form as a prelude to the more detailed description that is presented later.

The subject matter disclosed and claimed herein, in one embodiment thereof, comprises a carport tent faraday cage device. The device is primarily comprised of a tent body, further comprised of at least one roof frame, at least one wall frame, and at least one door. The roof frame and wall frame are both further comprised of at least one vertical frame member and at least one horizontal frame member. The door is further comprised of at least one fastener and at least one lock. The fastener allows the door to be fastened open or closed while the lock functions to keep individuals out of the interior space of the device, thus keeping the users vehicle and other electronic devices safe.

Further, the device is comprised of a rubber base. The base is comprised of wire mesh. The rubber base is also comprised of a floor, further comprised of a top surface and at least one movable track. The device further is comprised of at least one entrance ramp to allow a vehicle to enter into the device easily.

The device also is comprised of at least one grounding stake, further comprised of a body, a pointed end, and at least one tether. The grounding stake takes the electromagnetic radiation that hits the device and directs it into the ground causing no electrical damage to any of the contents inside the device.

In one embodiment, the device is comprised of at least one light source located in the interior space of the device. The light source is further powered by at least one battery. The light source allows the user to be able to see inside the interior space when the lighting is inadequate.

Accordingly, the carport tent faraday cage device of the present invention is particularly advantageous as it provides users with a novel carport. Further, the device provides users with an easy way to protect their vehicles and other large electronics from electromagnetic radiation such as an EMP and a solar flare. The device uses a tent body, further comprised of a conducting metal to repel electromagnetic radiation directing it into the ground via the grounding stakes. In this manner, the carport tent faraday cage device overcomes the limitations of existing known in the art.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and are intended to include all such aspects and their equivalents. Other advantages and novel features will become apparent from the following detailed description when considered in conjunction with the drawings.

BRIEF DESCRIPTION OF THE DRAWINGS

The description refers to provided drawings in which similar reference characters refer to similar parts throughout the different views, and in which.

DETAILED DESCRIPTION

Figure 1:
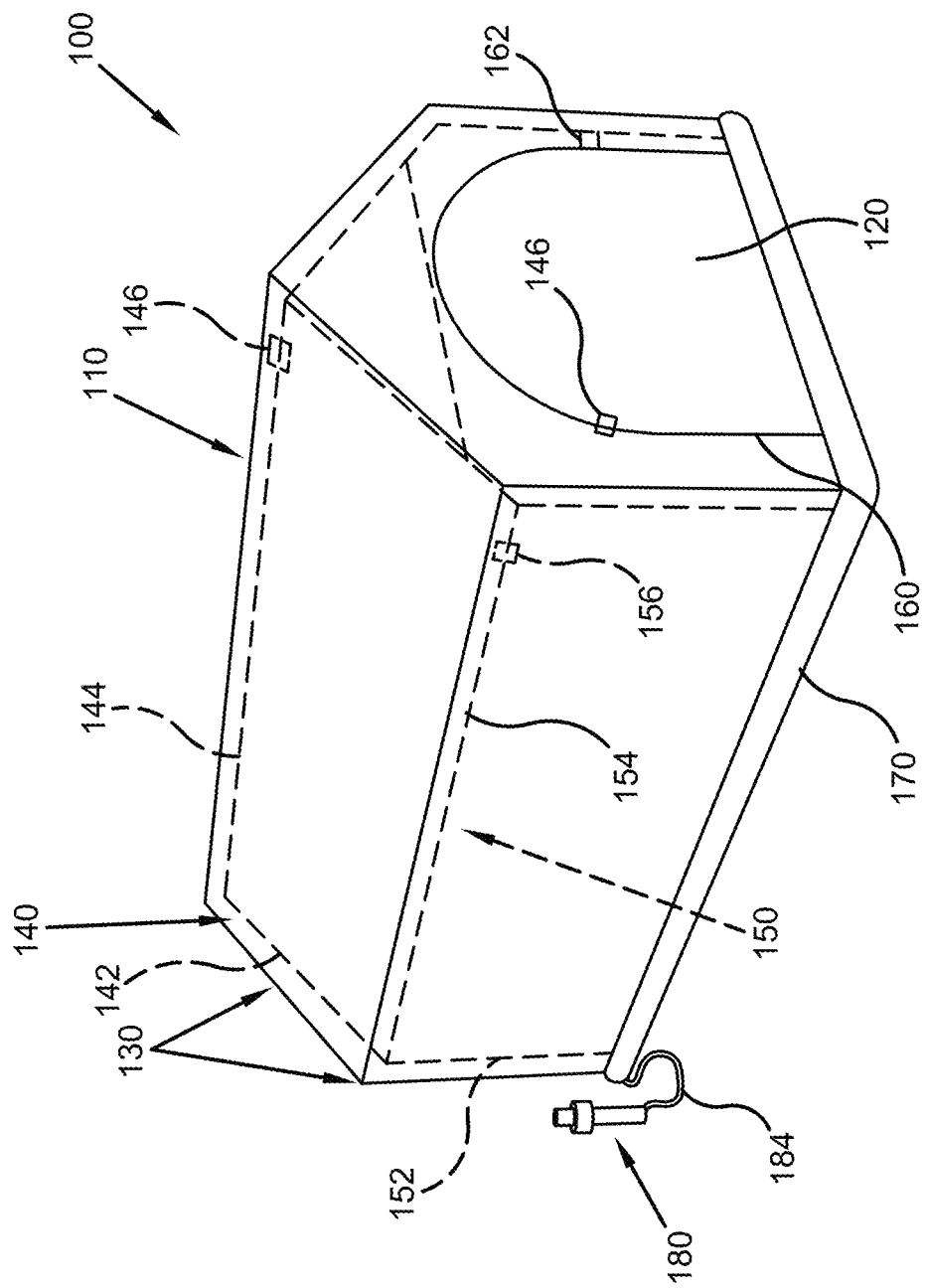
FIG. 1 illustrates a perspective view of one potential embodiment of a carport tent faraday cage device of the present invention while closed in accordance with the disclosed architecture.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof. Various embodiments are discussed hereinafter. It should be noted that the figures are described only to facilitate the description of the embodiments. They are not intended as an exhaustive description of the invention and do not limit the scope of the invention. Additionally, an illustrated embodiment need not have all the aspects or advantages shown. Thus, in other embodiments, any of the features described herein from different embodiments may be combined.

As noted above, there is a long-felt need in the art for a there exists a long-felt need in the art for an improved carport. There also exists a long-felt need in the art for a carport that can protect the electronics of a vehicle from electromagnetic radiation like an EMP or solar flare. There also exists a long-felt need in the art for a faraday cage that an individual can park their vehicle in to protect it and other items from electromagnetic radiation. There also exists a long-felt need in the art for a safe, secure, and convenient storage area for any personal or commercial vehicle as well as other larger electronic devices.

The present invention, in one exemplary embodiment, is comprised of a carport tent faraday cage device. The device is primarily comprised of a tent body, further comprised of at least one roof frame, at least one wall frame, and at least one door. The roof frame and wall frame are both further comprised of at least one vertical frame member and at least one horizontal frame member. The door is further comprised of at least one fastener and at least one lock. The fastener allows the door to be fastened open or closed while the lock functions to keep individuals out of the interior space of the device, thus keeping the users vehicle and other electronic devices safe.

Further, the device is comprised of a rubber base, further comprised of wire mesh. The rubber base is further comprised of a floor, further comprised of a top surface with at least one movable track. The device further is comprised of at least one entrance ramp to allow car to enter and exit the device easily.

The device also is comprised of at least one grounding stake, further comprised of a body, a pointed end, and at least one tether. The grounding stake takes the electromagnetic radiation that hits the device and directs it into the ground causing no electrical damage to any of the contents inside the device.

In one embodiment, the device is comprised of at least one light source located in the interior space of the device. The light source is further powered by at least one battery. The light source allows the user to be able to see inside the interior space when the lighting is inadequate.

Referring initially to the drawings, FIG. 1 illustrates a perspective view of one potential embodiment of a carport tent faraday cage device 100 of the present invention while closed in accordance with the disclosed architecture. The device 100 is primarily comprised of a tent body 110, further comprised of at least one roof frame 140, at least one wall frame 150, and a rubber base 170.

The tent body 110 can be any shape known in the art such as, but not limited to: square, rectangular, but is preferably pentagonal in shape. The tent body 110 is further comprised of a frame 130. The frame 130 is further comprised of at least one roof frame 140 and at least one wall frame 150. The frame 130 can be any material known in the art such as, but not limited to: plastic, wood, PVC, metal. In the preferred embodiment, the frame 130 is comprised of a rigid plastic material such as, but not limited to: acrylic, polycarbonate, polyethylene, thermoplastic, acrylonitrile butadiene styrene, low density polyethylene, medium density polyethylene, high density polyethylene, polyethylene terephthalate, polyvinyl chloride, polystyrene, polylactic acid, acetal, nylon, fiberglass, biodegradable plastic etc.

The roof frames 140 are further comprised of at least one vertical frame member 142 and at least one horizontal frame member 144. The vertical frame members 142, 152 and the horizontal frame members 144, 154 can be any shape known in the art such as, but not limited to: tubular, rectangular, square, triangular, etc.

In the preferred embodiment, the vertical frame members 142, 152 and the horizontal frame members 144, 154 are removable from one another. This allows the user to take the device 100 apart and move it to a new location if necessary. The vertical frame members 142, 152 and the horizontal frame members 144, 154 may be attached and detached to each other via fasteners 146, 156. The fasteners 146, 156 allow for the device to be attached and detached with minimal effort. There are a plurality of fasteners that may be used such as, but not limited to: threaded fastener, snap button, tongue and groove, buckle, hook and loop, etc.

In another embodiment, the vertical frame members 142, 152 and the horizontal frame members 144, 154 are attached in a fixed position so they cannot come apart. The frame 130 being fixed allows for the device 100 to be able to handle harsher adverse weather conditions. The fixed attachment does however, restrict the user from taking the device 100 apart or moving the device 100 easily.

The tent body 110 is further comprised of at least one door 120. The door 120 is further comprised of at least one fastener 160 in order to open and shut the door 120. The fastener 160 may be any fastener known in the art such as, but not limited to: hook and loop, snap button, magnetic, tongue and groove, zipper. Further, there is at least one fastener 162 located on the outside of the door 162 that attaches to the tent body 110 in order to hold the door 120 back away from the opening so a user can drive their vehicle 10 into the device 100 without hitting the door 120. The fastener 162 may be any fastener known in the art such as, but not limited to: hook and loop, snap button, magnetic, tongue and groove.

In one embodiment, the door 120 may be further comprised of at least one lock 122. The lock 122 provides the user with a way to secure the device 100 so an individual cannot access the device 100 and steal any of the user's vehicles or other belongings. There are a plurality of locks 122 that may be used such as, but not limited to: a padlock, a deadbolt lock, a cam lock, a rim/mortise lock, a euro profile cylinder lock, an interchangeable core cylinder lock, a furniture latch lock, a rim latch lock, a biometric fingerprint scanning lock, an RFID key fob lock, a mechanical dial lock, a numerical combination lock, a pedestal lock, a draw lock, a fixed core lock, etc.

The device 100 is further comprised of at least one grounding stake 180. The grounding stake 180 may be any conducting metal known in the art such as, but not limited to: copper, zinc, aluminum, brass, silver, nickel, iron, steel, lead, etc. The grounding stake 180 is further comprised of at least one tether 184. The tether 184 connects the grounding stake 180 to the tent body 110. The tether 184 may be any conducting wire known in the art but is preferably a copper wire. The tether 184 allows the electrical current to travel from the tent body 110 through the tether 184 to the grounding stake 180. The grounding stake 180 then directs the electrical current into the ground where it cannot damage the user's vehicles or electrical supplies. In the preferred embodiment, the grounding stake 180 and the tether 184 are coated in a corrosion inhibitor. The corrosion inhibitor can be any corrosion inhibitor known in the art.

Figure 2:
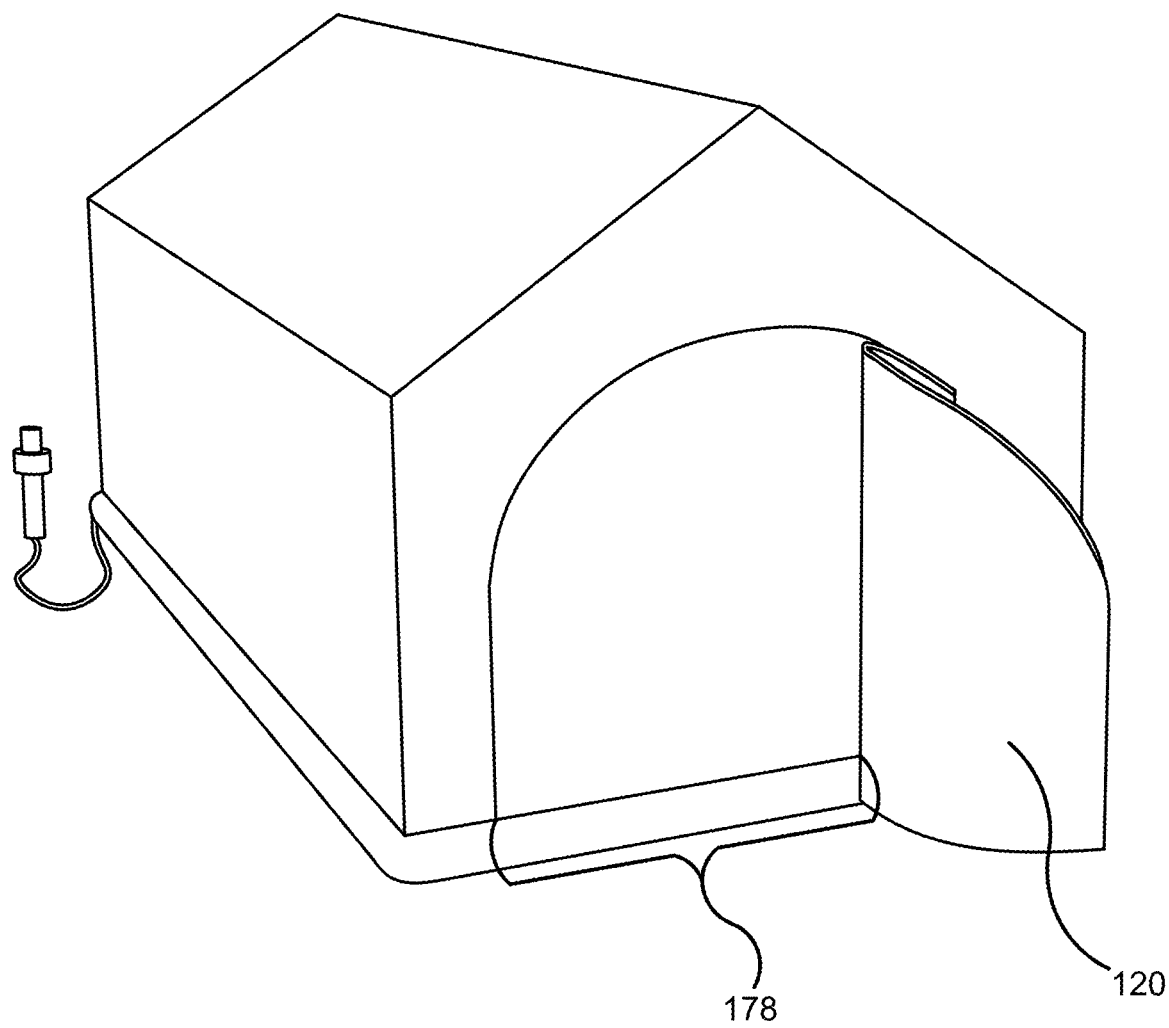
FIG. 2 illustrates a perspective view of one potential embodiment of a carport tent faraday cage device of the present invention while open in accordance with the disclosed architecture.

FIG. 2 illustrates a perspective view of one potential embodiment of a carport tent faraday cage device 100 of the present invention while open in accordance with the disclosed architecture. In the preferred embodiment, the device 100 is further comprised of at least one entrance ramp 178.

The entrance ramp 178 provides a way for a user to drive their vehicle 10 into the device 100 without damaging the device 100. The entrance ramp 178 can be made from any material known in the art but is preferably made from a rubber material. The rubber material may be any rubber material such as, but not limited to: natural rubbers, neoprene rubber elastomer, silicone rubber elastomer, ethylene propylene diene monomer rubber, butyl rubber, nitrile rubber, buna-n rubber, styrene-butadiene rubber elastomers, viton rubber elastomer, diaphragm rubber, thermoplastic rubber, etc.

Figure 3:
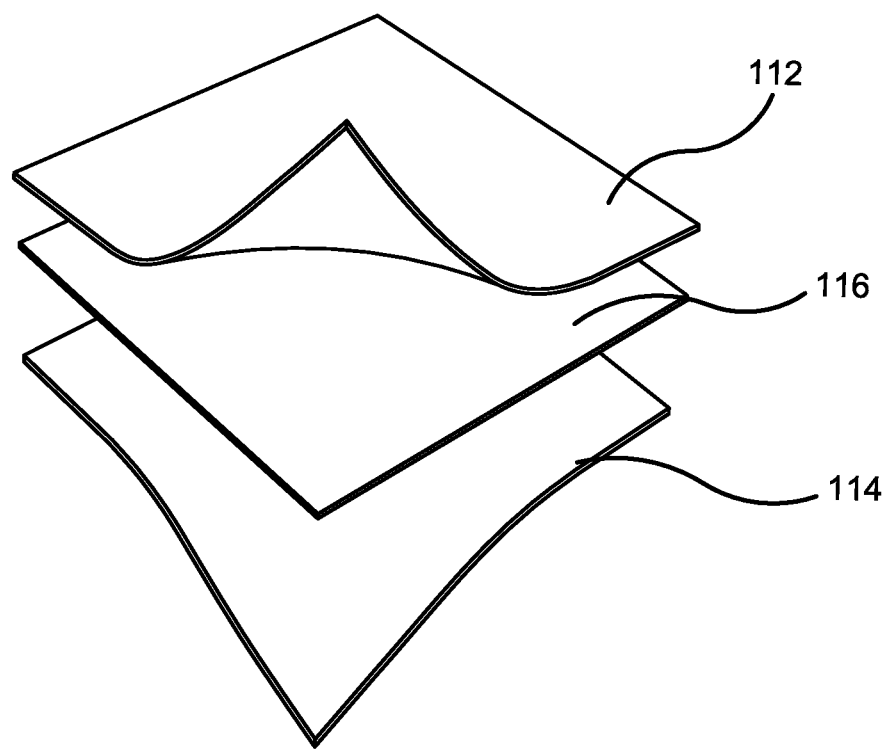
FIG. 3 illustrates an exploded view of one potential embodiment of a body material of one potential embodiment of a carport tent faraday cage device of the present invention in accordance with the disclosed architecture.

FIG. 3 illustrates an exploded view of one potential embodiment of a body material of one potential embodiment of a carport tent faraday cage device 100 of the present invention in accordance with the disclosed architecture. The material that the tent body 110 is made from is comprised of three layers: an exterior layer 112, a middle layer 116, and an interior layer 114. The exterior layer 112 is preferably made of any weatherproof, UV-resistant material known in the art such as, but not limited to: acrylic plastic, polycarbonate, high-density polyethylene, PUL, polyester, neoprene, Naugahyde, laminated cotton, nylon, etc. The middle layer 116 is comprised of a wiring made from a conducting metal but is preferably comprised of woven copper wiring. The middle layer 116 comprised of woven copper wiring that acts as the faraday cage and restricts the electromagnetic radiation from entering the device. The interior layer 114 may be comprised of any synthetic material that is known in the art.

Figure 4:
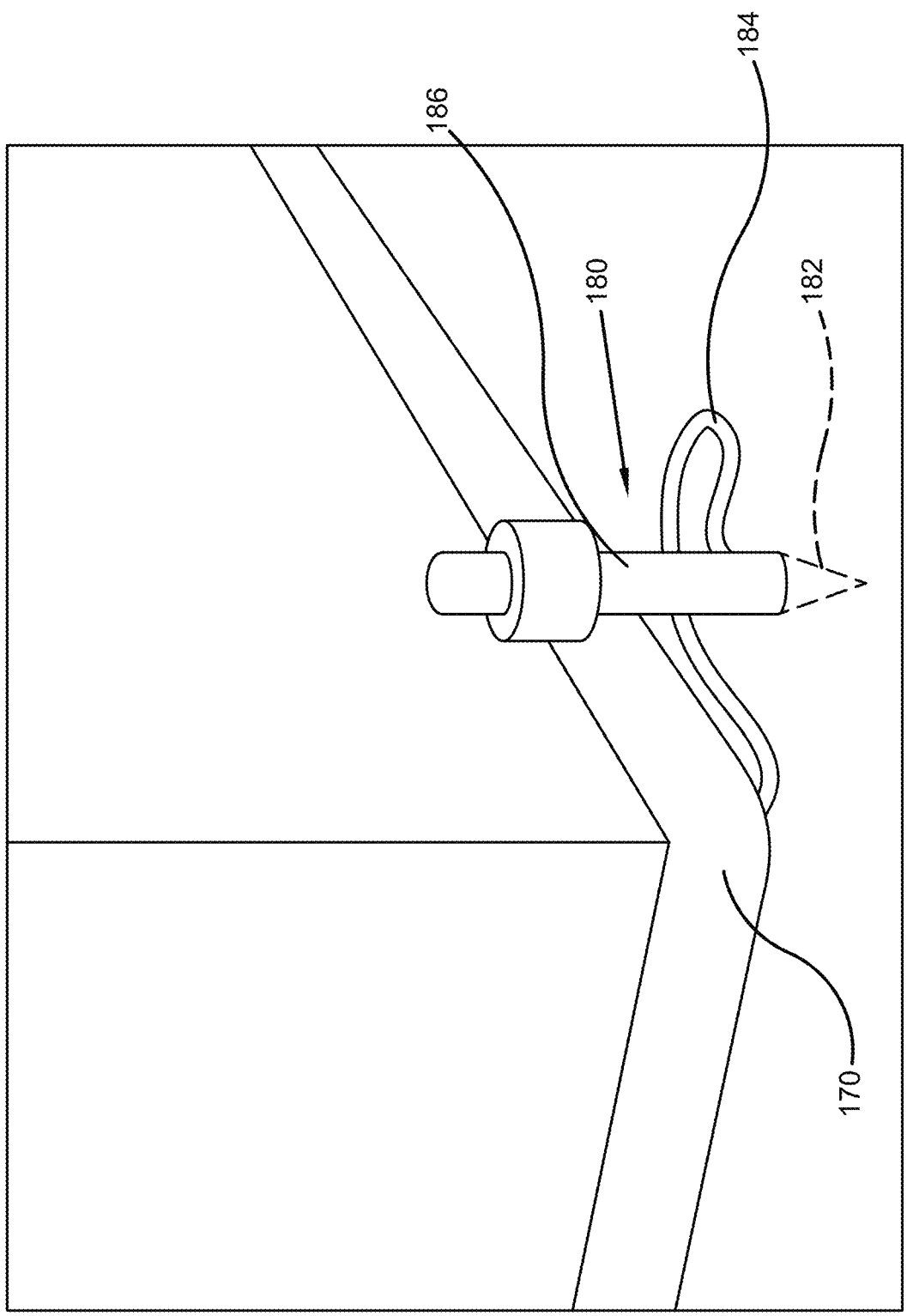
FIG. 4 illustrates an enhanced perspective view of one potential embodiment of a grounding stake of one potential embodiment of a carport tent faraday cage device of the present invention while closed in accordance with the disclosed architecture.

FIG. 4 illustrates an enhanced perspective view of one potential embodiment of a grounding stake 180 of one potential embodiment of a carport tent faraday cage device 100 of the present invention while closed in accordance with the disclosed architecture. The grounding stake 180 is comprised of a body 186, further comprised of a pointed end 182 and at least one tether 184. The grounding stake 180 may be any conducting metal known in the art such as, but not limited to: copper, zinc, aluminum, brass, silver, nickel, iron, steel, lead, etc. The grounding stake 180 is further comprised of a tether 184. The tether 184 connects the grounding stake 180 to the tent body 110. The tether 184 may be any conducting wire known in the art but is preferably a copper wire. The tether 184 allows the electrical current to travel from the tent body 110 through the tether 184 to the grounding stake 180. The grounding stake 180 then directs the electrical current into the ground where it cannot damage the user's vehicles or electrical supplies. In the preferred embodiment, the grounding stake 180 and the tether 184 are coated in a corrosion inhibitor. The corrosion inhibitor can be any corrosion inhibitor known in the art. The pointed end 182 allows the grounding stake 180 to sink into the ground. This allows the electricity to flow through the grounding stake 180 and into the ground.

Figure 5:
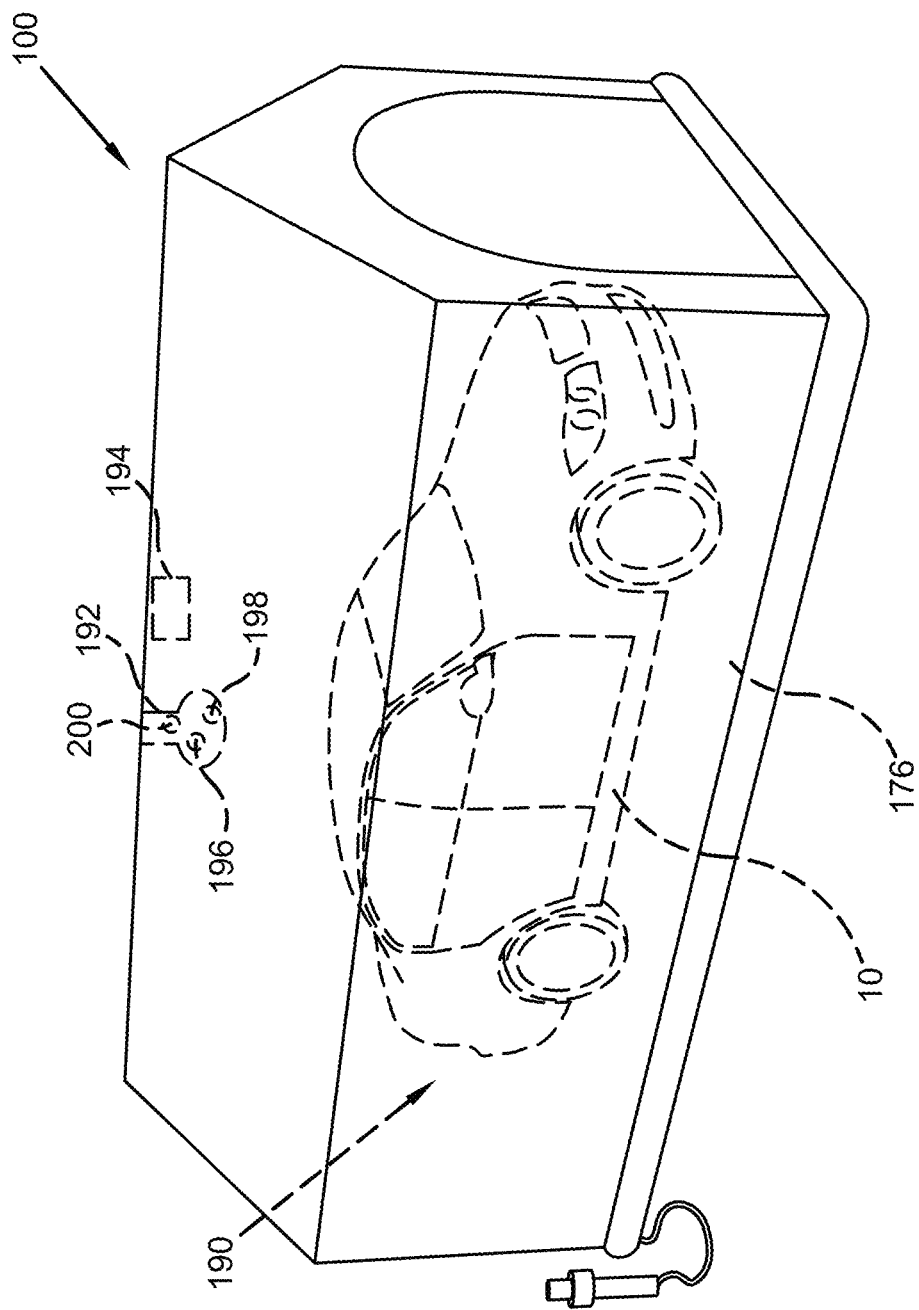
FIG. 5 illustrates a perspective view of one potential embodiment of a carport tent faraday cage device of the present invention while closed in accordance with the disclosed architecture.

FIG. 5 illustrates a perspective view of one potential embodiment of a vehicle 10 in the carport tent faraday cage device 100 of the present invention while closed in accordance with the disclosed architecture. In one embodiment, the device 100 is wide enough to fit at least one vehicle 10 comfortably. In another embodiment, the device 100 may be large enough to fit a plurality of vehicles 10.

In one embodiment, the interior space 190 may be comprised of at least one light source 192. The light source 192 may be any light source such as, but not limited to: LED light, white light, fluorescent light, incandescent light, neon light, etc. The light source 192 allows a user to be able to see the contents of the device 100 at night or when the lighting is poor. In one embodiment, the light source 192 may be powered by at least one battery 194. The battery 194 can be in the form of an alkaline, nickel-cadmium, nickel-metal hydride battery, etc., such as any 3V-12-volt DC battery 194 or other conventional battery 194 such as A, AA, AAA, etc. that supplies power to the light source 192. Throughout this specification the terms "battery" and "batteries" may be used interchangeably to refer to one or more wet or dry cells or batteries 194 of cells in which chemical energy is converted into electricity and used as a source of DC power. References to recharging or replacing batteries 194 may refer to recharging or replacing individual cells, individual batteries 194 of cells, or a package of multiple battery cells as is appropriate for any given battery 194 technology that may be used.

In one embodiment, the light source 192 may be turned off/on via at least one switch 196 located in the interior space 190 of the device 100. The switch 196 may be any switch known to one skilled in the art. In a differing embodiment, the light source 192 may be operated via motion sensor 198, further comprised of a processor 200. The processor 200 is in electrical communication with the motion sensor 198. When a user opens the door 120 to the device 100, the motion sensor 198 communicates with the processor 200 which further turns on the light source 192. Then when the door 120 is shut by the user, and there is no movement for a period of time, the motion sensor 198 communicates with the processor 200, which then turns off the light source 192.

Figure 6:
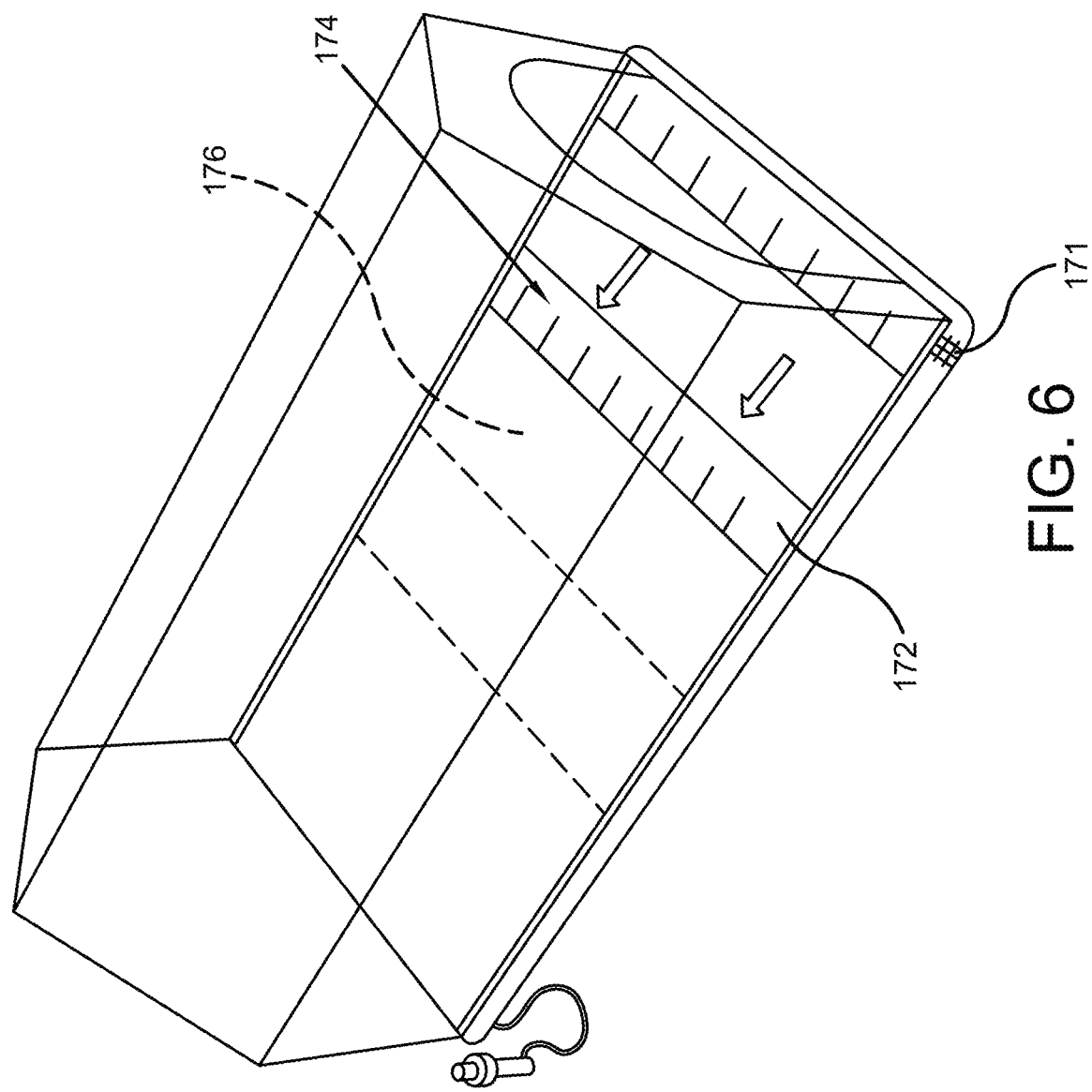
FIG. 6 illustrates a perspective view of a floor of one potential embodiment of a carport tent faraday cage device of the present invention while closed in accordance with the disclosed architecture.

FIG. 6 illustrates a perspective view of a floor of one potential embodiment of a carport tent faraday cage device 100 of the present invention while closed in accordance with the disclosed architecture. The device 100 is comprised of at least one floor panel 176, further comprised of a rubber base 170 with a top surface 172. The rubber base 170 is further comprised of a wire mesh 171. The wire mesh 171 can be made from any metal material known in the art. The mesh 171 adds strength and durability to the rubber base 170 so that it can support the weight of vehicles 10 and other items. Each floor panel 176 is further comprised of at least one fastener 174. The fastener 174 allows a floor panel 176 to be modular to attach one panel 176 to another panel 176 in any orientation or size that the user desires. In the preferred embodiment, one panel 176 has a male fastener in the form of a rod and another panel 176 has a female fastener in the form of an opening that receives the male fastener of the other panel 176. In this manner, at least two panels 176 can interlock. In one embodiment, the fastener 174 may be at least one bolt that allows two panels 176 to be bolted together. In a further embodiment, the fastener 174 may be at least one track that receives the panels 176 while bolted together.

The ramp 178 may attach to the base 170 using the same fastener 174 types. The modular panels 176 allow the device 100 to be easily transported or stored when not in use, as well as allow a user to customize the overall dimensions of the device 100. Each panel 176 is preferably a copper (or other conducting metal) panel encased in a rubber material. The base 170 and panel 176 can be made from a plurality of materials such as, but not limited to: plastic, rubber, wood, etc. In one embodiment, the device 100 is only comprised of panels 176 instead of a rubber base 170. The base 170 and/or panels 176 may be connected to the tether 184 to ground the panels 176.

Certain terms are used throughout the following description and claims to refer to particular features or components. As one skilled in the art will appreciate, different persons may refer to the same feature or component by different names. This document does not intend to distinguish between components or features that differ in name but not structure or function. As used herein "carport tent faraday cage device" and "device" are interchangeable and refer to the carport tent faraday cage device 100 of the present invention.

Notwithstanding the foregoing, the carport tent faraday cage device 100 of the present invention and its various components can be of any suitable size and configuration as is known in the art without affecting the overall concept of the invention, provided that they accomplish the above-stated objectives. One of ordinary skill in the art will appreciate that the size, configuration, and material of the carport tent faraday cage device 100 as shown in the FIGS. are for illustrative purposes only, and that many other sizes and shapes of the carport tent faraday cage device 100 are well within the scope of the present disclosure. Although the dimensions of the carport tent faraday cage device 100 are important design parameters for user convenience, the carport tent faraday cage device 100 may be of any size, shape and/or configuration that ensures optimal performance during use and/or that suits the user's needs and/or preferences.

Various modifications and additions can be made to the exemplary embodiments discussed without departing from the scope of the present invention. While the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A carport tent faraday cage device comprising:
   a tent body comprised of an exterior layer, an interior layer and a middle layer;
   a door positioned on the tent body;
   a frame that supports the tent body;
   a rubber base comprised of a wire mesh;
   an entrance ramp;
   a grounding stake;
   a tether; and
   an interior space.

2. The carport tent faraday cage device of claim 1, wherein the grounding stake is comprised of a conducting metal.

3. The carport tent faraday cage device of claim 1, wherein the tether attaches to the tent body.

4. The carport tent faraday cage device of claim 3, wherein the tether is a conducting wire.

5. The carport tent faraday cage device of claim 4, wherein the tether is a copper wire.

6. A carport tent faraday cage device comprising:
a tent body comprised of an exterior layer, an interior layer and a middle layer;
a door positioned on the tent body;
a frame that supports the tent body;
a rubber base comprised of a wire mesh;
an entrance ramp positioned in front of the door;
a grounding stake;
a tether that attaches to the tent body; and
an interior space within the tent body.

7. The carport tent faraday cage device of claim 6 further comprised of a light source positioned within the interior space.

8. The carport tent faraday cage device of claim 7, wherein the light source is operated via a motion sensor.

9. The carport tent faraday cage device of claim 6, wherein the rubber base is comprised of a floor and a track.

10. The carport tent faraday cage device of claim 9, wherein the floor attaches to the track.

11. The carport tent faraday cage device of claim 10, wherein the track allows the floor to move.

12. The carport tent faraday cage device of claim 6, wherein the wire mesh is positioned within the rubber base.

13. The carport tent faraday cage device of claim 6, wherein the door is comprised of a fastener.

14. The carport tent faraday cage device of claim 13, wherein the door is further comprised of a lock.

15. The carport tent faraday cage device of claim 14, wherein the tether is a conducting wire.

16. The carport tent faraday cage device of claim 15, wherein the tether is a copper wire.

* * * * *